United States Patent
Fujii et al.

(10) Patent No.: US 8,916,848 B2
(45) Date of Patent: Dec. 23, 2014

(54) RESISTANCE CHANGE DEVICE AND MEMORY CELL ARRAY

(75) Inventors: Shosuke Fujii, Yokohama (JP); Daisuke Matsushita, Fujisawa (JP); Yuichiro Mitani, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/598,305

(22) Filed: Aug. 29, 2012

(65) Prior Publication Data

US 2012/0319074 A1    Dec. 20, 2012

Related U.S. Application Data

(63) Continuation of application No. PCT/JP2011/056506, filed on Mar. 11, 2011.

(30) Foreign Application Priority Data

Mar. 26, 2010    (JP) ................. 2010-073697

(51) Int. Cl.
| | | |
|---|---|---|
| H01L 47/00 | (2006.01) | |
| H01L 45/00 | (2006.01) | |
| H01L 27/24 | (2006.01) | |
| G11C 13/00 | (2006.01) | |

(52) U.S. Cl.
CPC ........ G11C 13/0007 (2013.01); H01L 45/1266 (2013.01); H01L 27/2463 (2013.01); H01L 45/145 (2013.01); H01L 27/2436 (2013.01); G11C 2213/79 (2013.01); H01L 45/1233 (2013.01); H01L 45/085 (2013.01); H01L 27/2409 (2013.01)

USPC ......................... 257/4; 257/2; 257/5

(58) Field of Classification Search
USPC ......................................... 257/1–5
See application file for complete search history.

(56) References Cited

U.S. PATENT DOCUMENTS

| | | | | |
|---|---|---|---|---|
| 8,450,709 | B2* | 5/2013 | Kusai et al. ............ | 257/2 |
| 8,664,632 | B2* | 3/2014 | Matsushita et al. ........ | 257/4 |
| 2008/0054270 | A1* | 3/2008 | Suda ................. | 257/77 |
| 2008/0099827 | A1* | 5/2008 | Kreupl ............. | 257/324 |
| 2008/0111245 | A1* | 5/2008 | Osano et al. .......... | 257/767 |

(Continued)

FOREIGN PATENT DOCUMENTS

| | | |
|---|---|---|
| CN | 101501849 A | 8/2009 |
| CN | 101621114 A | 1/2010 |

(Continued)

OTHER PUBLICATIONS

Face. (n.d.) The American Heritage® Dictionary of the English Language, Fourth Edition. (2003). Retrieved Mar. 19, 2014 from http://www.thefreedictionary.com/face.*

(Continued)

*Primary Examiner* — Fernando L Toledo
*Assistant Examiner* — Christine C Lau
(74) *Attorney, Agent, or Firm* — Oblon, Spivak, McClelland, Maier & Neustadt, L.L.P.

(57) ABSTRACT

According to one embodiment, a resistance change device includes a first electrode including a metal, a second electrode, and an amorphous oxide layer including Si and O between the first and second electrode, the layer having a concentration gradient of O and a first peak thereof in a direction from the first electrode to the second electrode.

23 Claims, 9 Drawing Sheets

(56) References Cited

U.S. PATENT DOCUMENTS

| | | | |
|---|---|---|---|
| 2009/0014707 A1* | 1/2009 | Lu et al. | 257/4 |
| 2009/0242865 A1 | 10/2009 | Lung et al. | |
| 2010/0085798 A1 | 4/2010 | Lu et al. | |
| 2010/0259966 A1* | 10/2010 | Kanzawa et al. | 365/148 |
| 2010/0301301 A1* | 12/2010 | Suda et al. | 257/2 |
| 2010/0308341 A1* | 12/2010 | Suda et al. | 257/77 |
| 2012/0007035 A1* | 1/2012 | Jo et al. | 257/4 |
| 2012/0043519 A1* | 2/2012 | Jo et al. | 257/4 |
| 2012/0205608 A1* | 8/2012 | Yamauchi et al. | 257/4 |
| 2012/0211719 A1* | 8/2012 | Haimoto et al. | 257/4 |
| 2012/0243292 A1* | 9/2012 | Takashima et al. | 365/148 |
| 2013/0234095 A1* | 9/2013 | Baba | 257/4 |
| 2013/0234097 A1* | 9/2013 | Fujii et al. | 257/4 |

FOREIGN PATENT DOCUMENTS

| | | |
|---|---|---|
| JP | 2009-105383 | 5/2009 |
| JP | 2009-135291 | 6/2009 |
| JP | 2009-164580 | 7/2009 |
| TW | 201010152 A1 | 3/2010 |
| WO | WO 2009/069364 A1 | 6/2009 |
| WO | WO 2009069364 A1 * | 6/2009 |
| WO | WO 2009/147790 A1 | 12/2009 |

OTHER PUBLICATIONS

U.S. Appl. No. 13/714,946, filed Dec. 14, 2012, Ishikawa, et al.
Japanese Office Action issued Aug. 30, 2013, in Japan Patent Application No. 2010-073697 (with English translation).
Office Action issued in corresponding Taiwan Patent Application No. 100108953 dated Apr. 11, 2014 (with English translation).
Office Action issued Jul. 25, 2014 in Chinese Patent Application No. 201180011998.X (with English Translation).
English translation of the International Preliminary Report on Patentability issued Oct. 11, 2012, in PCT/JP2011/056506.
International Search Report mailed May 24, 2011 in PCT/JP2011/056506 filed Mar. 11, 2011 (in English).
International Written Opinion mailed May 24, 2011 in PCT/JP2011/056506 filed Mar. 11, 2011 (in English).
Yu Chao, et al., "Fully Room-Temperature-Fabricated Nonvolaitle Resistive Memory for Ultrafast and High-Density Memory Application", Nano Letter, 2009, vol. 9, No. 4, pp. 1636-1643.
K. Kinoshita et al., "Reduction in the reset current in a resistive random access memory consiting of NiOx brought about by reducing a parasitic capacitance", American Institute of Physics Letters, 2008, vol. 93, No. 033506, 3 pages.
Chikako Yoshida et al., "Direct observation of oxygen movement during resistance switching in NiO/Pt film", Applied Physics Letter, 2008, vol. 93, No. 042106, 3 pages.
Andrei A. Istratov, et al., "Intrinsic Diffusion Coefficient of Interstitial Copper in Silicon", The American Physical Society, vol. 81, No. 6, Aug. 10, 1998, pp. 1243-1249.
J.D. Mcbrayer et al., "Diffusion of Metals in Silicon Dioxide", J. Electrochem. Society: Solid-State Science and Technology, Jun. 1986, pp. 1242-1246.

* cited by examiner

| Element (Metal) | Ion radius (Å) |
|---|---|
| Cr | 0.69 |
| W | 0.76 |
| Al | 0.68 |
| Cu | 0.71 |
| Ni | 0.70 |
| Co | 0.69 |
| Ta | 0.78 |
| Zr | 0.98 |
| Hf | 0.97 |
| Ti | 1.00 |
| Ag | 1.08 |

RESISTANCE CHANGE DEVICE AND MEMORY CELL ARRAY

CROSS REFERENCE TO RELATED APPLICATIONS

This application is a Continuation application of PCT Application No. PCT/JP2011/056506, filed Mar. 11, 2011 and based upon and claiming the benefit of priority from Japanese Patent Application No. 2010-073697, filed Mar. 26, 2010, the entire contents of all of which are incorporated herein by reference.

FIELD

Embodiments described herein relate generally to a resistance change device and a memory cell array.

BACKGROUND

In a resistance switching metal oxide layer which is sandwiched between upper and lower electrodes and contains nickel (Ni) and oxygen (O) and in which the concentration of O increases from the lower electrode toward the upper electrode, O in the resistance switching metal oxide layer diffuses by Joule heat when an electric current flows from the upper electrode to the lower electrode, thereby locally forming a heavily doped Ni portion. In this structure, it is difficult to control a resistance change because the concentration of O in the resistance switching metal oxide is nonuniform.

DETAILED DESCRIPTION

In general, according to one embodiment, a resistance change device comprising: a first electrode including a metal; a second electrode; and an amorphous oxide layer including Si and O between the first and second electrode, the layer having a concentration gradient of O and a first peak thereof in a direction from the first electrode to the second electrode.

A memory cell array comprising: first wirings including a metal which extends to a first direction; second wirings which extends to a second direction being cross to the first direction; and memory cells provided between the first and second wirings, each of the memory cells comprising a resistance change element and a rectifying element connected in series, wherein the resistance change element comprises an amorphous oxide layer including Si and O, and has a concentration gradient of O and a first peak thereof in a third direction being cross to the first and second direction.

A resistance change device comprising: first electrodes each including a metal which are arranged in a first direction; second electrodes which are arranged in the first direction, and which are faced the first electrodes one by one in a second direction being cross to the first direction; and an amorphous oxide layer including Si and O between the first electrodes and the second electrodes, the layer having a concentration gradient of O and a first peak thereof in the second direction.

First Embodiment

Figure 1:
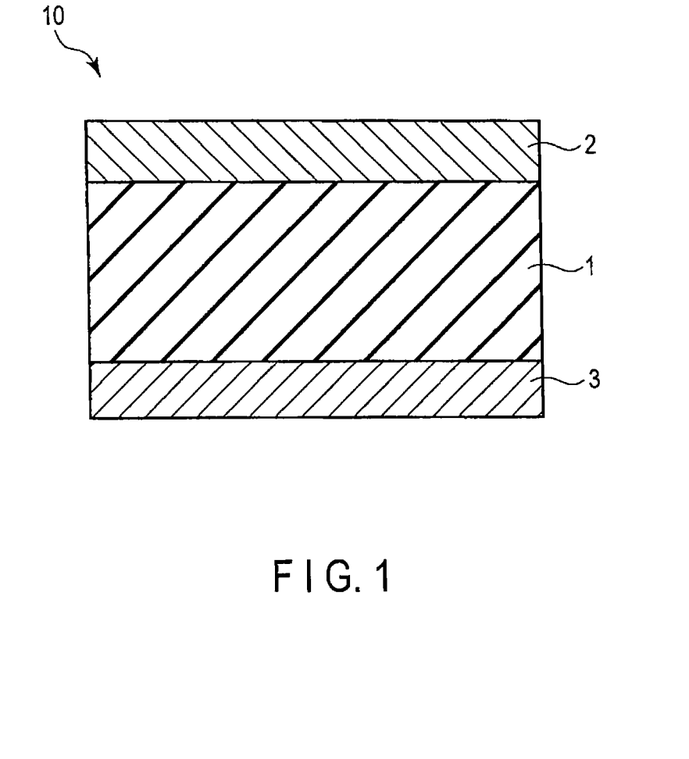
FIG. 1 shows a resistance change element.

FIG. 1 is a view showing resistance change element 10 according to the first embodiment.

In resistance change element 10, oxide layer 1 is sandwiched between two electrodes 2 and 3.

As electrode 2, it is possible to use a metal selected from, e.g., Ag, Ti, Ni, Co, Al, Cr, Cu, W, Hf, Ta, and Zr. It is also possible to use a nitride or carbide of any of the above-mentioned metals as electrode 2. Furthermore, an alloy containing at least one of these metals can be used.

As electrode 3, it is possible to use, e.g., Si in which B is heavily doped. This is so because the resistivity of Si can be set to 0.005 Ωcm or less by heavily doping B. The electrode 3 is not limited to Si in which B is heavily doped, and can also be another impurity-doped Si. Examples of the impurity are As and P. It is also possible to use known electrode materials such as Ti, Ta, W, and their nitrides.

Oxide layer 1 is amorphous and contains O and Si. In oxide layer 1, the concentration of O increases from electrode 2 toward electrode 3, and at least one region where the concentration gradient of O has a peak value exists. That is, at least one region where the concentration gradient of O has a peak value in the stacking direction of oxide layer 1 exists. In other words, oxide layer 1 includes a layer in which the concentration of O is low and a layer in which the concentration of O is high, and the concentration gradient increases in the boundary between the layer in which the concentration of O is high and layer in which the concentration of O is low. The composition of O hardly changes even when a voltage is applied between electrodes 2 and 3. This is so because oxide layer 1 is amorphous and hence has no crystal structure, or Si strongly bonds to O by a covalent bond. The film thickness of oxide layer 1 is, e.g., 1 (inclusive) to 300 nm. When resistance change element 10 is downsized, the film thickness of oxide layer 1 is preferably as small as possible. When this is taken into consideration, the film thickness of oxide layer 1 is preferably 2 (inclusive) to 50 (inclusive) nm.

Figure 2A:
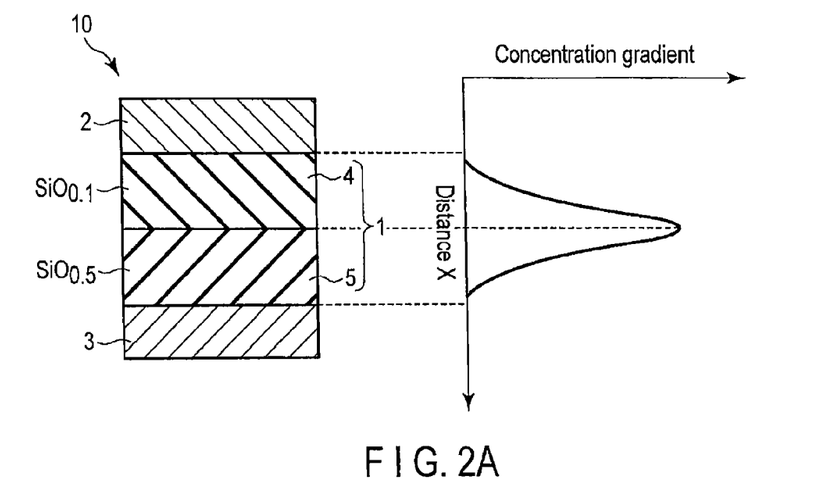
FIGS. 2A and 2B show a composition of an oxide layer.
Figure 2B:
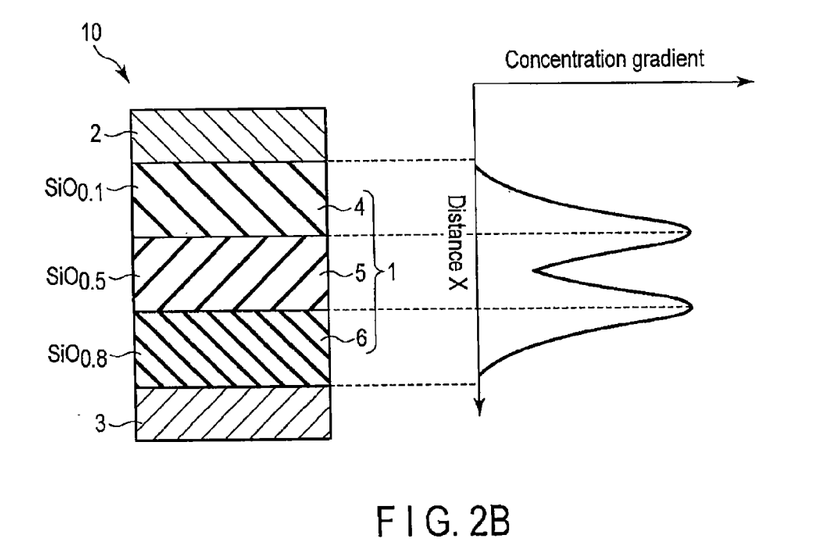

FIGS. 2A and 2B are views for explaining the concentration gradient of O contained in oxide layer 1. The abscissa (rightward in the drawing surface) indicates the value of the concentration gradient, and the ordinate (downward in the drawing surface) indicates distance x from electrode 2 to electrode 3.

As shown in FIG. 2A, when oxide layer 1 includes, e.g., a layer (first layer 4) having composition $SiO_{0.1}$ and a layer (second layer 5) having composition $SiO_{0.5}$, the composition of O rises by 0.4 in the boundary between first layer 4 and second layer 5. In this state, the concentration gradient has a peak value in the boundary between first layer 4 and second layer 5. In this case, the film thickness of first layer 4 and second layer 5 is, e.g., 50 nm.

Also, when oxide layer 1 has two peak values of the concentration gradient, third layer 6 having a concentration higher than that of second layer 5 exists as shown in FIG. 2B. Note that the composition of O in third layer 6 is 0.8.

Figure 3A:
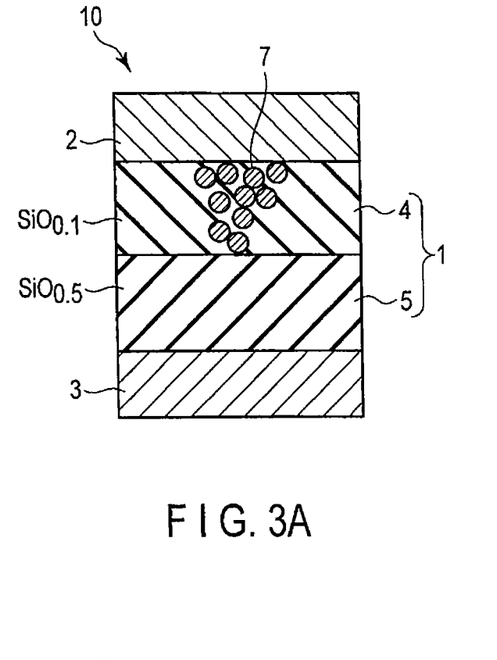
FIGS. 3A and 3B show an operation principle of the resistance change element.
Figure 3B:
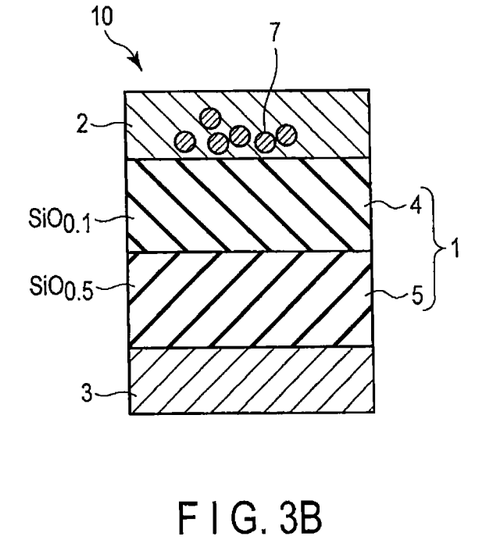

Next, the operation principle of resistance change element 10 according to this embodiment will be explained below. FIGS. 3A and 3B are views for explaining the operation principle of resistance change element 10 according to this embodiment. The operation principle will be explained by taking an arrangement in which the concentration gradient of O in oxide layer 1 has one peak value as an example. The explanation will be made by assuming that oxide layer 1 includes first layer 4 and second layer 5.

As shown in FIG. 3A, when a voltage by which electrode 2 becomes positive with respect to electrode 3 of resistance change element 10 is applied, the metal contained in electrode 2 changes into ions. In oxide layer 1, the metal ions diffuse toward electrode 3. Filament 7 is formed in this manner. Filament 7 has high conductivity because it is made of the metal. Accordingly, the resistance of first layer 4 decreases. The formation of filament 7 stops in the boundary between first layer 4 and second layer 5. This is so because the concentration of O in second layer 5 is higher than that in first layer 4, so the metal ion diffusion rate decreases in second layer 5. Note that the value of the resistance can be read by supplying a weak electric current from electrode 2 to electrode 3. Note also that a tunneling current flows through second layer 5 if filament 7 is formed only up to first layer 4.

As shown in FIG. 3B, when a voltage by which electrode 2 becomes negative with respect to electrode 3 is applied in this state, the metal ions forming filament 7 existing in first layer 4 diffuse from electrode 3 toward electrode 2, and filament 7 disappears. As a consequence, the resistance of first layer 4 rises.

As shown in FIG. 3A, when the voltage by which electrode 2 becomes positive with respect to electrode 3 of resistance change element 10 is applied again, the metal contained in electrode 2 changes into ions, and the metal ions diffuse in oxide layer 1 toward electrode 3, thereby forming filament 7. That is, filament 7 can be formed in or extinguished from oxide layer 1 by applying the voltage by which electrode 2 becomes positive or negative with respect to electrode 3.

Accordingly, binary resistance change element 10 can be provided by setting, e.g., the state in which filament 7 is formed in oxide layer 1 as '1', and the state in which no filament 7 is formed as '0'. Information is thus recorded in resistance change element 10. Note that since filament 7 is formed so as not to extend to electrode 3, the amount of electric current to be supplied from electrode 2 to electrode 3 can be reduced.

Also, a ternary (multilevel) element can be obtained by extending filament 7 to electrode 3, and setting the state in which filament 7 is formed to electrode 3 as '2'. "Multilevel" indicates a state in which the number of levels is three or more.

In oxide layer 1 as described above, the concentration of O increases from electrode 2 toward electrode 3, and at least one region where the concentration gradient has a peak value exists. Therefore, the composition ratios of O in first layer 4 and second layer 5 of resistance change element 10 explained with reference to, e.g., FIGS. 2A and 2B are different. Accordingly, the diffusion rates of the metal ions diffusing from electrode 2 are different in first layer 4 and second layer 5. Multilevel resistance change element 10 can be implemented by using this difference between the metal ion diffusion rates.

A method of increasing the number of levels of resistance change element 10 according to this embodiment to three or more (i.e., a method of obtaining a multilevel element) will now be explained.

FIGS. 4A, 4B, 4C, and 4D are exemplary views each showing the current-voltage characteristic when a voltage by which electrode 2 becomes positive with respect to electrode 3 is applied, and the corresponding structure of resistance change element 10. Note that the explanation will be made by assuming that oxide layer 1 includes first layer 4, second layer 5, and third layer 6.

Since oxide layer 1 has different composition ratios of O, the velocity of metal ions diffusing from electrode 2 toward electrode 3 changes from one layer to another.

Figure 4A:
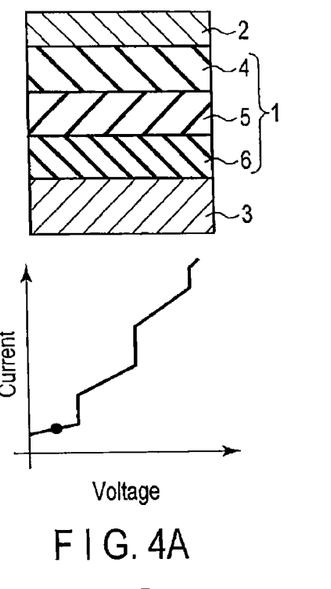
FIGS. 4A to 4D show a multilevel operation of the resistance change element.
Figure 4B:
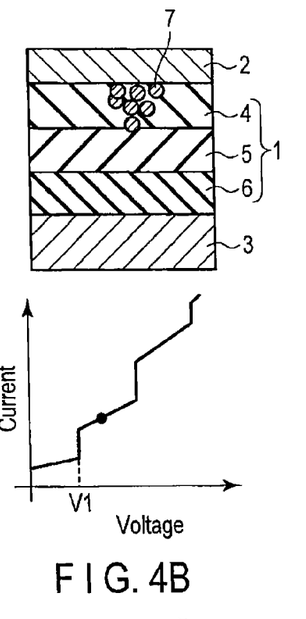

FIG. 4A is a view showing a state in which the metal of electrode 2 does not diffuse in oxide layer 1. When a voltage by which electrode 2 becomes positive with respect to electrode 3 is applied to resistance change element 10 in this state and a given voltage (V1) is reached, the metal of electrode 2 changes into ions, and the metal ions form filament 7 in first layer 4, as shown in FIG. 4B. In this state, the current value abruptly rises as indicated by the solid circle in the lower half of FIG. 4B. This is so because conductive filament 7 is formed in first layer 4, and this largely decreases the resistance value of resistance change element 10. The formation of filament 7 stops in the boundary between first layer 4 and second layer 5. This is so because the concentration of O in second layer 5 is higher than that in first layer 4, so the metal ion diffusion rate decreases in second layer 5.

Figure 4C:
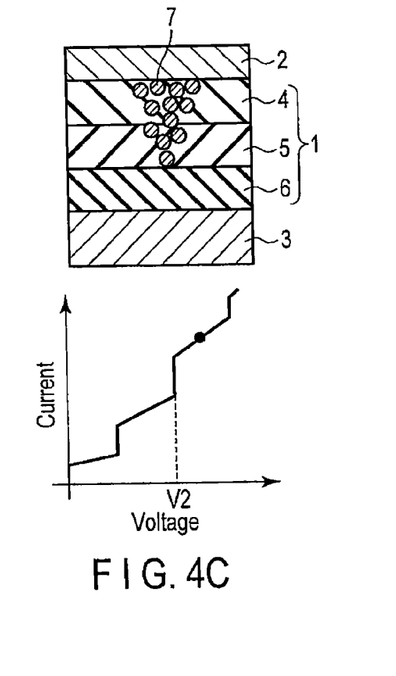

Then, a voltage (V2) higher than voltage V1 is applied such that electrode 2 becomes positive with respect to electrode 3. Consequently, as shown in FIG. 4C, the metal ions forming filament 7 in first layer 4 diffuse in second layer 5, and filament 7 extends. In this state, the current value further rises (the solid circle in the lower half of FIG. 4C). This is so because the length of conductive filament 7 further increases. The formation of filament 7 stops in the boundary between second layer 5 and third layer 6. This is so because the concentration of O in third layer 6 is higher than that in second layer 5, so the metal ion diffusion rate decreases in third layer 6.

Figure 4D:
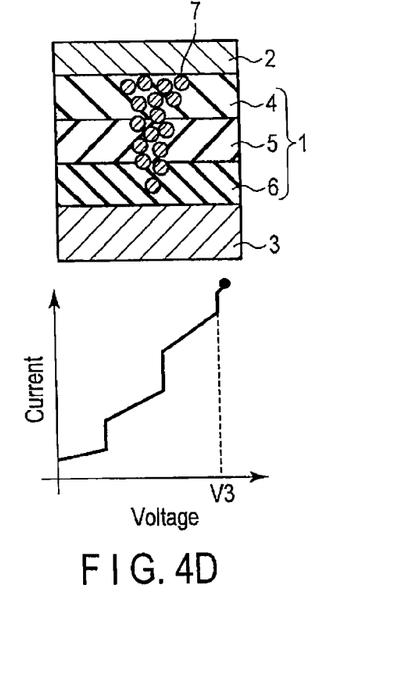

Subsequently, a voltage (V3) higher than voltage V2 is applied such that electrode 2 becomes positive with respect to electrode 3. Consequently, as shown in FIG. 4D, the metal ions forming filament 7 in second electrode 5 diffuse in third layer 6, and filament 7 extends. In this state, the current value further rises (the solid circle in the lower half of FIG. 4D). This is so because the length of conductive filament 7 further increases. Thus, filament 7 is formed from electrode 2 to electrode 3.

As explained above, the states shown in FIGS. 4A, 4B, 4C, and 4D change step by step with respect to voltages V1, V2, and V3 having certain threshold values. This makes it possible to implement multilevel resistance change element 10. Note that the values of voltages V1, V2, and V3 are defined by the range of, e.g., 0.1 (inclusive) to 15 (inclusive) V. When resistance change element 10 is downsized to a size of, e.g., about 50 nm, the values of voltages V1, V2, and V3 are preferably defined by the range of 0.1 (inclusive) to 6 (inclusive) V.

Also, when a voltage by which electrode 2 becomes negative with respect to electrode 3 is applied in the state shown in FIGS. 4B, 4C, and 4D, i.e., the state in which filament 7 is formed in oxide layer 1, the metal ions forming filament 7 diffuse from electrode 3 toward electrode 2 due to the applied electric field, so filament 7 can be extinguished. That is, filament 7 can be formed in or extinguished from oxide layer 1 by applying a voltage by which electrode 2 becomes negative or positive with respect to electrode 3. The value of this voltage by which electrode 2 becomes negative with respect to electrode 3 is also defined by the range of, e.g., −0.1 (inclusive) to −15 (inclusive) V. When resistance change element 10 is downsized to a size of, e.g., about 50 nm, the voltage value is preferably defined by the range of −0.1 (inclusive) to −6 (inclusive) V.

Accordingly, multilevel resistance change element 10 can be provided by setting, e.g., the state in which no filament 7 is formed in oxide layer 1 as '0', the state in which filament 7 is formed up to first layer 4 as '1', the state in which filament 7 is formed up to second layer 5 as '2', and the state in which filament 7 is formed up to third layer 6 as '3'.

It is also possible to provide a resistance change element having a larger number of levels by controlling the threshold voltages such that regions in each of which the concentration gradient has a peak value exist in oxide layer 1.

Figure 5:
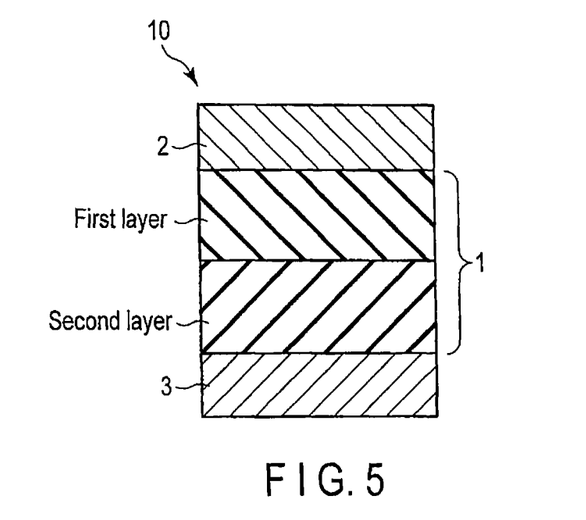
FIG. 5 shows a resistance change element.

A favorable amount of O contained in oxide layer 1, which is necessary to obtain multilevel resistance change element 10, will be explained below. To simplify the explanation, the explanation will be made by assuming that two layers (first and second layers) having different oxygen concentrations are formed between electrodes 2 and 3 as shown in FIG. 5. That is, one concentration gradient peak value exists in oxide layer 1.

As described above, the operation principle of resistance change element 10 according to this embodiment is to diffuse the metal of electrode 2 as ions in oxide layer 1 by applying a voltage between electrodes 2 and 3, thereby forming filament 7 in oxide layer 1. According to the results of research made by the present inventors, filament 7 can be formed by a fast voltage pulse of 100 ns or less. This reveals that the metal ions forming the filament diffuse not in a relatively slow diffusion form such as a vacancy exchange type or lattice substitution type diffusion form but in an interstitial insertion type diffusion form. That is, the metal ions forming filament 7 diffuse in a charged state as they hop between lattices in oxide layer 1. In this state, the easiness of the diffusion of the metal ions in oxide layer 1 is generally determined by the easiness of the hopping of the metal ions. That is, a hopping rate $v(S^{-1})$ of the metal ions is represented by $$v = v_0 \exp\left(-\frac{E_A}{kT}\right) \quad (1)$$

where $v_o(S^{-1})$ is attempt frequency of hopping and a value equivalent to about the Debye frequency, and $E_A$ is the activation energy necessary for hopping. The metal forming filament 7 is pushed inside oxide layer 1 by the electric field. That is, since the metal moves as it is pushed inside oxide layer 1 by the electric field, the easiness of the movement has a close relationship to the ion radius of the metal. That is, the larger the ion radius, the higher the activation energy required for interstitial hopping.

Figure 6:
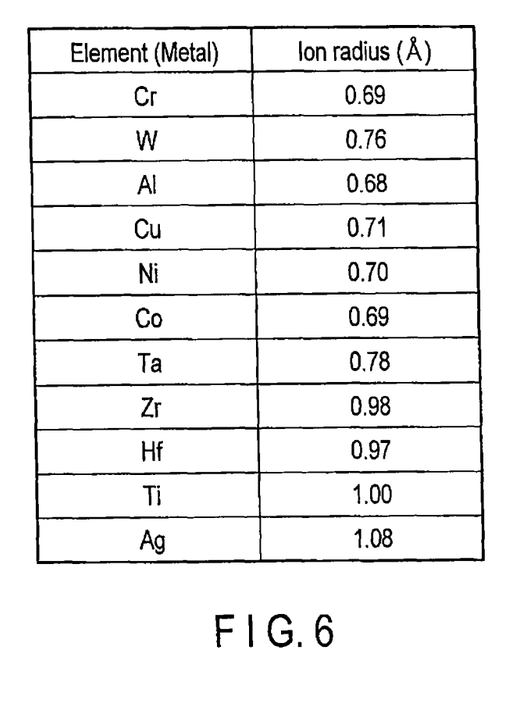
FIG. 6 shows an ion radius of a metal element.

FIG. 6 is a view showing the ion radii of metals. The explanation will be made by using Ag and Cu as representatives of these metals.

The conditions of the O content in oxide layer 1 capable of a multilevel operation will be explained below. First, the state (initial state) in which no filament 7 is formed in oxide layer 1 will be explained. When a voltage is applied between electrodes 2 and 3 in this state, the metal contained electrode 2 diffuses in oxide layer 1 due to diffusion fluxes $J_{top}(A)$ and $J_{mid}(A)$ indicated by $$J_{top} = qEv_{top} = qEv_0\exp\left(-\frac{E_A}{kT}\right) \text{ (First layer)} \quad (2)$$

$$J_{mid} = qE'v_{mid} = qE'v_0\exp\left(-\frac{E_A'}{kT}\right) \text{ (Second layer)} \quad (3)$$

where k is the Boltzmann constant, T is the temperature (K), $E_A$ and $E'_A$ are the hopping activation energies (eV) of the metal ions in the first and second layers, and E and E' are the electric fields (V/cm) applied to the first and second layers.

Next, the state in which filament 7 is formed in the first layer will be explained. When filament 7 is formed in the first layer, the formation portion becomes conductive, so no voltage drop occurs in the first layer. Therefore, the electric field applied to the second layer rises due to the effect obtained because the film thickness to which the voltage is applied decreases. Accordingly, a diffusion flux $J_{mid}'$ after filament 7 is formed in the first layer is represented by $$J_{mid}' = qE''v_{mid} = qE''v_0\exp\left(-\frac{E_A'}{kT}\right) \quad (4)$$

(Second Layer in State of Forming Filament in First Layer)

Since E'<E'', this rise in electric field increases the diffusion flux of the charged ions. No multilevel operation can be achieved if the diffusion flux in the second layer is equal to or larger than that in the first layer immediately before the setting, i.e., if the diffusion flux in the second layer is in a state indicated by $$qE''v_0\exp\left(-\frac{E_A'}{kT}\right) \geq qEv_0\exp\left(-\frac{E_A}{kT}\right) \quad (5)$$

This is so because the metal ions diffuse more easily than in the first layer before filament 7 is formed in the second layer, so the formation of filament 7 does not stop in the second layer, and the charged ions diffuse in the second layer as well and form filament 7.

In this state, the multilevel operation intended by this embodiment cannot be achieved. Therefore, the condition that no metal ions diffuse to the second layer even when filament 7 is formed in the first layer is the condition for achieving the multilevel operation. This condition is indicated by $$qE''v_0\exp\left(-\frac{E_A'}{kT}\right) \ll qEv_0\exp\left(-\frac{E_A}{kT}\right) \quad (6)$$

To accurately form filament 7 in oxide layer 1, the diffusion flux preferably changes by an order of magnitude or more, and this condition is indicated by $$\frac{E''\exp\left(-\frac{E_A'}{kT}\right)}{E\exp\left(-\frac{E_A}{kT}\right)} \approx \frac{\exp\left(-\frac{E_A'}{kT}\right)}{\exp\left(-\frac{E_A}{kT}\right)} < \frac{1}{10} \quad (7)$$

$$\Leftrightarrow \exp\left(\frac{E_A - E_A'}{kT}\right) < \frac{1}{10} \quad (8)$$

$$\Leftrightarrow E_A' - E_A > kT\ln\left(\frac{1}{10}\right) \quad (9)$$

Since the operation temperature is room temperature (300 K), the activation energy difference ($E'_A-E_A$) must be 0.06 eV or more according to the calculation. That is, if the difference between the activation energies of the interstitial hopping of the metal ions is 0.06 eV or more between the first and second layers, the multilevel operation intended by this embodiment can reliably be achieved. In this embodiment, the activation energies are controlled by changing the concentrations of O contained in the first and second layers.

For example, the contents of Si and O necessary for the multilevel operation when the electrodes are made of Cu will be explained below. The diffusion activation energy of Cu ions in Si (O content=0%) is 0.18 eV. By contrast, the activation energy in $SiO_2$ (O content=67%) is 1.2 eV. When interpolated, the change in O content required to change the activation energy by 0.06 eV from the above value is 4%. That is, the multilevel operation can be achieved when the O content in the second layer is higher by 4% or more than that in the first layer.

When using Ag ions, the activation energy in $SiO_2$ (O content=67%) is 1.3 eV, and that in Si is 0.87 eV. In this case, the multilevel operation is possible when the O content difference is 9.3% or more.

Conventionally, a filament is formed by controlling the value of an electric current to be supplied to a resistance change element (this method will be referred to as a current compliance method hereinafter). In the current compliance method, however, a filament is difficult to form because, e.g., an electric current flowing from the parasitic capacitance of wiring connected to a resistance change element has a large influence on the reliability of the element.

Since the influence of the parasitic capacitance of wiring is large especially when forming a filament, a transistor must be formed adjacent to a resistance change element in order to accurately form a filament by the current compliance method. Accordingly, the current compliance method is unsuitable for the downsizing of a resistance change element. In addition, the current compliance method generates Joule heat in an oxide layer. If resistance change elements are arranged adjacent to each other, therefore, heat generated by a given resistance change element may change the composition of an oxide layer in an adjacent resistance change element.

On the other hand, resistance change element 10 according to this embodiment uses the metal ion diffusion rate difference caused by the concentration difference in oxide layer 1, and voltage control. This makes it possible to achieve the multilevel operation by voltage control, and obviates the need to form any additional transistor. Accordingly, a filament can be formed more accurately than when using the conventional current compliance method.

Next, a method of manufacturing resistance change element 10 according to this embodiment will be explained below.

First, B ions are implanted in electrode 3 made of an Si single-crystal substrate at, e.g., an acceleration voltage of 30 keV and a dose of $2\times10^{15}$ $cm^{-2}$, and activation annealing is performed, thereby forming a p-type Si region.

Then, oxide layer 1 made of Si is deposited by, e.g., CVD (Chemical Vapor Deposition). In this step, the ratio of O in oxide layer 1 is controlled by adjusting the flow rate ratio of $SiH_4$ as a source gas to oxygen. In the structure of this embodiment, the O content sequentially decreases from the lowermost layer of a multilayered film of oxide layer 1. For example, the O contents are 20%, 10%, and 0.5% in this order from the lowermost layer. The O contents can be analyzed by, e.g., XPS (X-ray Photoelectron Spectroscopy), SIMS (Secondary Ion Mass Spectrometry), or TEM-EDS (Transmission Electron Microscopy-Energy Dispersive Spectroscopy).

After that, resistance change element 10 according to this embodiment is obtained by depositing electrode 2 made of Ag.

The embodiment has been explained above. Note that any modifications and changes of the embodiment can be made without departing from the spirit and scope of the basic concept.

The embodiment also relates to the technique of a resistance change element alone, and is applicable to any circuit regardless of a method of connecting the resistance change element.

Figure 7:
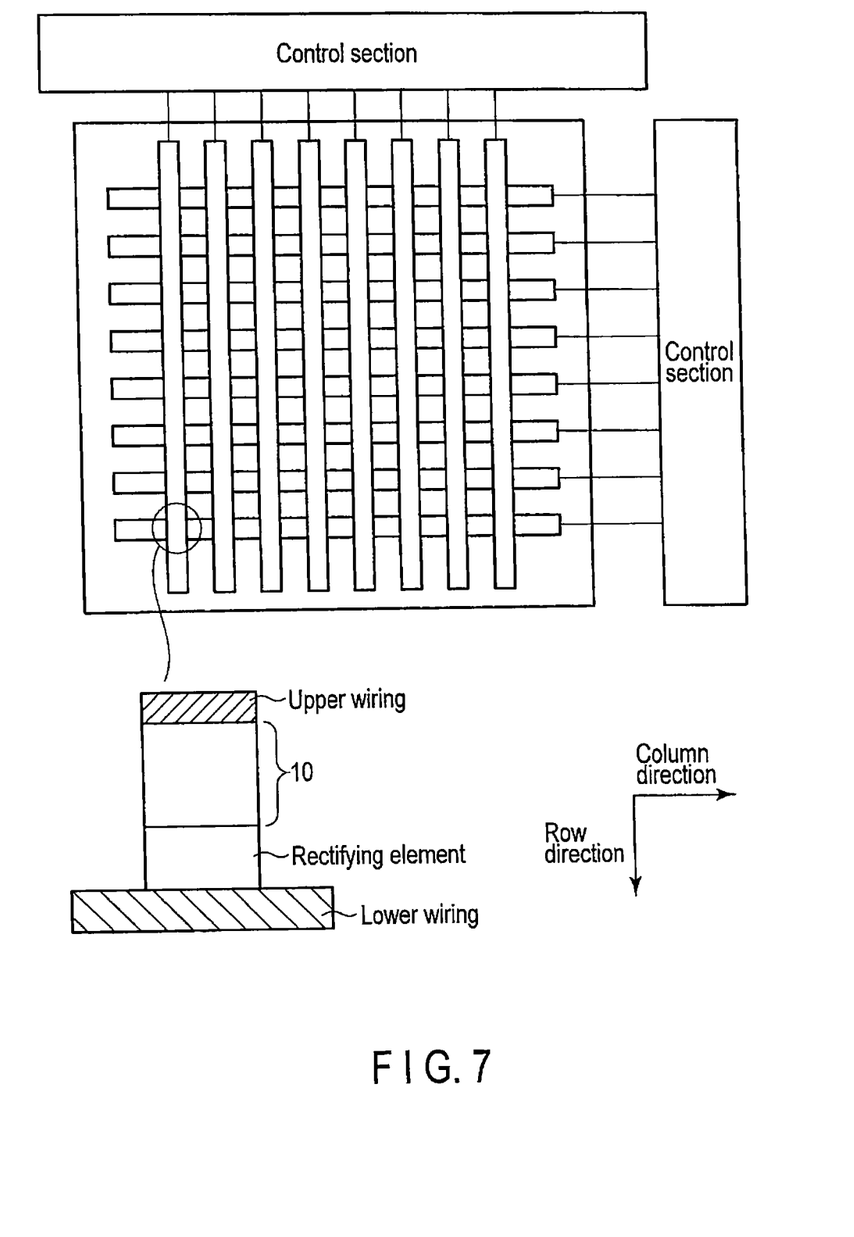
FIG. 7 shows a memory cell array.

As shown in FIG. 7, an example is a so-called, cross-point type memory array in which resistance change element 10 and a rectifying element are formed at each intersection of upper and lower wirings (the rectifying element is more specifically a diode element such as a P-I-N diode). In this arrangement, the upper wirings are formed in the column direction, and the lower wirings are formed in the row direction. The operation principle of this memory cell array is to apply a voltage to resistance change element 10 as a recording target by selecting one of the upper wirings and one of the lower wirings. More specifically, control sections apply arbitrary voltages to the selected upper and lower wirings.

The rectifying element may be omitted, when the resistance change element 10 has a rectifying function.

Figure 8:
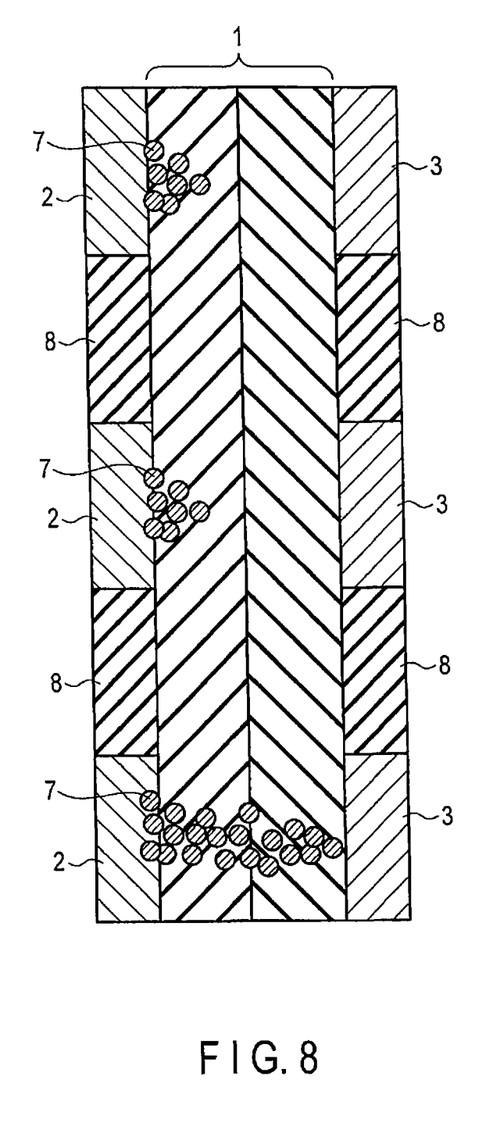
FIG. 8 shows a resistance change device.

As shown in FIG. 8, another example is a three-dimensional multilayered structure (resistance change device) in which oxide layer 1 is sandwiched between a structure (first stack) formed by alternately stacking electrodes 2 and insulating films 8 on a substrate (not shown), and a structure (second stack) formed by alternately stacking electrodes 3 and insulating films 8. In this structure, electrodes 3 are formed to face electrodes 2, and each pair of electrodes 2 and 3 forms filament 7. The insulating films 8 are made of, e.g., $Al_2O_3$ or $SiO_2$.

Figure 9:
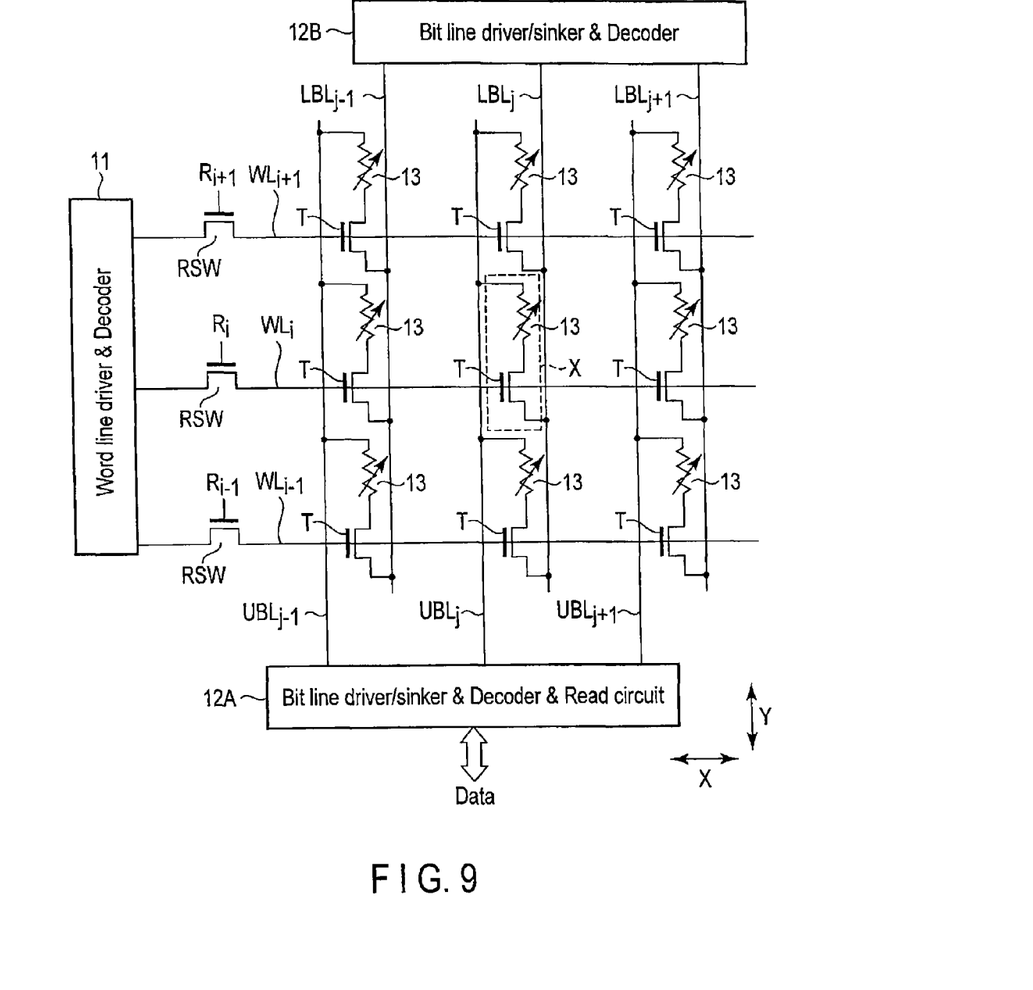
FIGS. 9 and 10 show a resistance change memory.

FIG. 9 shows an example of a resistance change memory.

A memory cell array has a one transistor-one element type.

Word lines $WL_{i-1}$, $WL_i$, and $WL_{i+1}$ run in the X direction, and bit lines $UBL_{j-1}$, $UBL_j$, $UBL_{j+1}$, $LBL_{j-1}$, $LBL_j$, and $LBL_{j+1}$ run in the Y direction.

One end of each of word lines $WL_{i-1}$, $WL_i$, and $WL_{i+1}$ is connected to word line driver & decoder 11 via MOS transistor RSW as a selection switch. One end of each of bit lines $UBL_{j-1}$, $UBL_j$, and $UBL_{j+1}$ is connected to bit line driver/sinker & decoder & read circuit 12A. One end of each of bit lines $LBL_{j-1}$, $LBL_j$, and $LBL_{j+1}$ is connected to bit line driver/sinker & decoder 12B.

Selection signals $R_{i-1}$, $R_i$, and $R_{i+1}$ for selecting one word line (row) are input to the gates of MOS transistors RSW. Bit line driver/sinker & decoder & read circuit 12A has a function of selecting one of bit lines $UBL_{j-1}$, $UBL_j$, and $UBL_{j+1}$. Bit line driver/sinker & decoder & read circuit 12B has a function of selecting one of bit lines $LBL_{j-1}$, $LBL_j$, and $LBL_{j+1}$.

One terminal of memory cell 13 is connected to a corresponding one of bit lines $UBL_{j-1}$, $UBL_j$, and $UBL_{j+1}$, and the other terminal of memory cell 13 is connected to a corresponding one of bit lines $LBL_{j-1}$, $LBL_j$, and $LBL_{j+1}$ via the source and drain of MOS transistor T. The gates of MOS transistors T are connected to word lines $WL_{i-1}$, $WL_i$, and $WL_{i+1}$.

In this structure, one MOS transistor T is connected to one memory cell 13. Therefore, a sneak current that poses a problem in the cross-point type does not occur, and the read/write reliability can improve.

Figure 10:
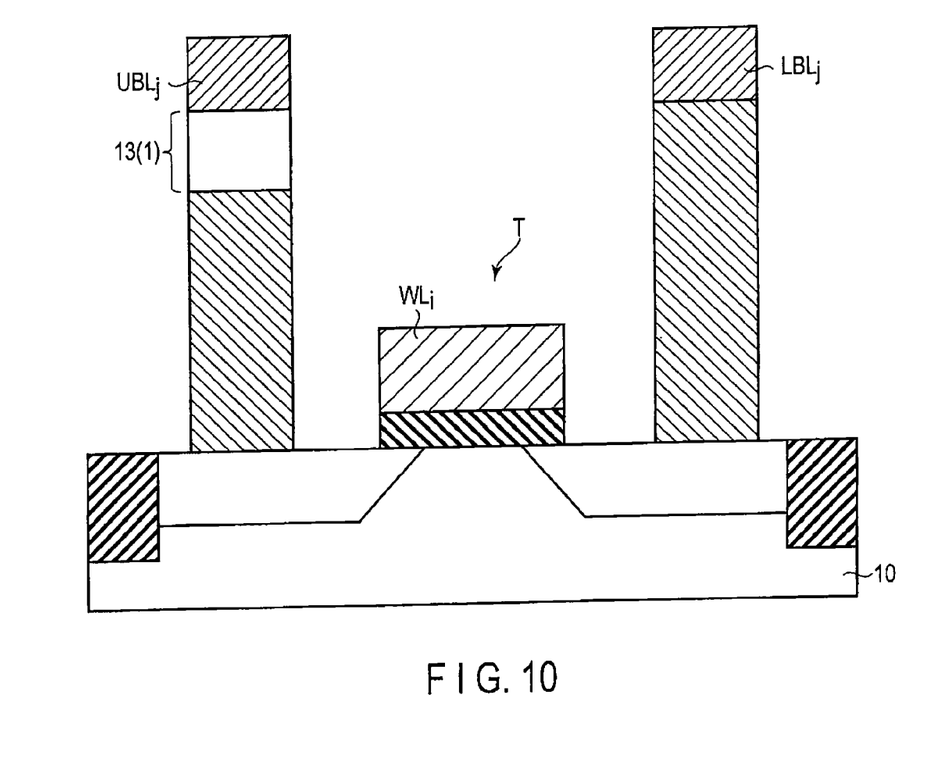

FIG. 10 shows the structure of portion X in FIG. 9.

MOS transistor T is formed on semiconductor substrate 100. One of the source and drain of MOS transistor T is connected to bit line $UBL_j$ via memory cell 13(1). The other one of the source and drain of MOS transistor T is connected to bit line $LBL_j$.

Memory cell 13 is a resistance change element of the embodiment. Accordingly, one memory cell 13 can store multilevel data having three or more levels.

The feature of the one transistor-one cell type described above is that the read/write reliability can be improved because one MOS transistor is connected to each memory cell 13. It is also possible to increase the degree of integration of memory cells 13 by improving, e.g., the layout of word lines $WL_{i-1}$, $WL_i$, and $WL_{i+1}$ and bit lines $UBL_{j-1}$, $UBL_j$, $UBL_{j+1}$, $LBL_{j-1}$, $LBL_j$, and $LBL_{j+1}$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change device comprising:
   a first electrode including a metal which contains at least one of Ag, Ti, Co, Cr, Cu, W, Hf, Ta and Zr;
   a second electrode; and
   an amorphous oxide layer including Si and O between the first and second electrode, the layer having a concentration gradient of O and a first peak thereof in a direction from the first electrode to the second electrode,
   wherein the second electrode is impurities-doped Si, and a concentration of O in the amorphous oxide layer increases in the direction from the first electrode to the second electrode.

2. The device of claim 1,
   wherein the oxide layer has a second peak of the concentration gradient in the direction.

3. The device of claim 1,
   wherein the oxide layer has peaks of the concentration gradient including the first peak in the direction.

4. The device of claim 1,
   wherein a value of the multilevel data is decided by a length of a filament which is provided between the first and second electrodes and which includes the metal.

5. The device of claim 1,
   wherein the device stores multilevel data by changing a voltage between the first and second electrodes to one selected from a group of two or more values different from each other.

6. The device of claim 1,
   wherein the amorphous oxide layer substantially consists of Si and O.

7. A memory cell array comprising:
   first wirings including a metal which extends to a first direction, the metal containing at least one of Ag, Ti, Co, Cr, Cu, W, Hf, Ta and Zr;
   second wirings which extends to a second direction being cross to the first direction; and
   memory cells provided between the first and second wirings, each of the memory cells comprising a resistance change element,
   wherein the resistance change element comprises an amorphous oxide layer including Si and O, and has a concentration gradient of O and a first peak thereof in a third direction being cross to the first and second direction,
   wherein the second wirings are impurities-doped Si, and a concentration of O in the amorphous oxide layer increases in the third direction from the first wirings to the second wirings.

8. The array of claim 7,
   wherein the oxide layer has a second peak of the concentration gradient in the third direction.

9. The array of claim 7,
   wherein the oxide layer has peaks of the concentration gradient including the first peak in the third direction.

10. The array of claim 7,
    wherein a value of the multilevel data is decided by a length of a filament which is provided between the selected first wiring and the selected second wiring and which includes the metal.

11. The device of claim 7,
    wherein one selected memory cell among the memory cells stores multilevel data by changing a voltage between a selected first wiring among the first wirings and a selected second wiring among the second wirings to one selected from a group of two or more values different from each other.

12. The device of claim 7,
    wherein the amorphous oxide layer substantially consists of Si and O.

13. A resistance change device comprising:
    first electrodes each including a metal which are arranged in a first direction, the metal containing at least one of Ag, Ti, Co, Cr, Cu, W, Hf, Ta and Zr;
    second electrodes which are arranged in the first direction, and facing the first electrodes one by one in a second direction being cross to the first direction; and
    an amorphous oxide layer including Si and O between the first electrodes and the second electrodes, the layer having a concentration gradient of O and a first peak thereof in the second direction,
    wherein the second electrodes are impurities-doped Si, and a concentration of O in the amorphous oxide layer increases in the second direction from the first electrodes to the second electrodes.

14. The device of claim 13,
    wherein the oxide layer has a second peak of the concentration gradient in the second direction.

15. The device of claim 13,
    wherein the oxide layer has peaks of the concentration gradient including the first peak in the second direction.

16. The device of claim 13,
    wherein a value of the multilevel data is decided by a length of a filament which is provided between one of the first electrodes and one of the second electrodes and which includes the metal.

17. The device of claim 13,
    wherein the device stores multilevel data in a portion between the first electrodes and the second electrodes by changing a voltage therebetween to one selected from a group of two or more values different from each other.

18. The device of claim 13,
    wherein the amorphous oxide layer substantially consists of Si and O.

19. A resistance change device comprising:
    a first electrode including a metal which contains at least one of Ag, Ti, Co, Cr, Cu, W, Hf, Ta and Zr;
    a second electrode including impurities-doped Si; and
    an amorphous oxide layer including Si and O between the first and second electrode, and a concentration of O in the amorphous oxide layer increases in a direction from the first electrode to the second electrode.

20. The device of claim 19,
wherein the oxide layer has a concentration gradient of O and a first peak thereof in the direction.

21. The device of claim 20,
wherein the oxide layer has a second peak of the concentration gradient in the direction.

22. The device of claim 20,
wherein the oxide layer has peaks of the concentration gradient including the first peak in the direction.

23. The device of claim 19,
wherein a value of the multilevel data is decided by a length of a filament which is provided between the first and second electrodes and which includes the metal.

* * * * *